United States Patent
Itagaki et al.

(10) Patent No.: US 8,415,198 B2
(45) Date of Patent: Apr. 9, 2013

(54) PRODUCTION METHOD OF THIN FILM TRANSISTOR USING AMORPHOUS OXIDE SEMICONDUCTOR FILM

(75) Inventors: Naho Itagaki, Yokohama (JP); Toru Den, Tokyo (JP); Nobuyuki Kaji, Kawasaki (JP); Ryo Hayashi, Yokohama (JP); Masafumi Sano, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/374,665

(22) PCT Filed: Jul. 26, 2007

(86) PCT No.: PCT/JP2007/065114
§ 371 (c)(1),
(2), (4) Date: Jan. 21, 2009

(87) PCT Pub. No.: WO2008/023553
PCT Pub. Date: Feb. 28, 2008

(65) Prior Publication Data
US 2009/0325341 A1      Dec. 31, 2009

(30) Foreign Application Priority Data
Aug. 23, 2006   (JP) .................................. 2006-226698

(51) Int. Cl.
*H01L 21/00*   (2006.01)
(52) U.S. Cl. ................ 438/104; 257/E21.411
(58) Field of Classification Search ............ 438/104; 257/E21.411
See application file for complete search history.

(56) References Cited

U.S. PATENT DOCUMENTS

| | | | |
|---|---|---|---|
| 5,512,538 A | 4/1996 | Den et al. | |
| 5,578,554 A | 11/1996 | Akimitsu et al. | |
| 5,583,093 A | 12/1996 | Den et al. | |
| 6,123,824 A | 9/2000 | Sano et al. | |
| 6,172,296 B1 | 1/2001 | Iwasaki et al. | |
| 6,303,945 B1 | 10/2001 | Saito et al. | |
| 6,331,474 B1 | 12/2001 | Hayashi et al. | |
| 6,344,608 B2 | 2/2002 | Kariya et al. | |
| 6,399,873 B1 | 6/2002 | Sano et al. | |

(Continued)

FOREIGN PATENT DOCUMENTS

| | | |
|---|---|---|
| JP | 60-250675 A | 12/1985 |
| JP | 8-264794 | 10/1996 |

(Continued)

OTHER PUBLICATIONS

Martins et al, Role of order and disorder on the electronic performances of oxide semiconductor thin film transistors, Feb. 21, 2007, Journal of applied physics 101, 044505 (2007), p. 1-8.*

(Continued)

*Primary Examiner* — William D Coleman
*Assistant Examiner* — Christine Enad
(74) *Attorney, Agent, or Firm* — Fitzpatrick, Cella, Harper & Scinto

(57) ABSTRACT

A production method of a thin film transistor including an active layer including an amorphous oxide semiconductor film, wherein a step of forming the active layer includes a first step of forming the oxide film in an atmosphere having an introduced oxygen partial pressure of $1\times10^{-3}$ Pa or less, and a second step of annealing the oxide film in an oxidative atmosphere after the first step.

15 Claims, 9 Drawing Sheets

U.S. PATENT DOCUMENTS

| | | | |
|---|---|---|---|
| 6,472,248 B2 | 10/2002 | Shiozaki et al. | |
| 6,476,409 B2 | 11/2002 | Iwasaki et al. | |
| 6,488,995 B1 | 12/2002 | Nishimoto et al. | |
| 6,613,603 B1 | 9/2003 | Sano | |
| 6,635,899 B2 | 10/2003 | Saito et al. | |
| 6,649,824 B1 | 11/2003 | Den et al. | |
| 6,653,165 B2 | 11/2003 | Kondo et al. | |
| 6,706,336 B2 | 3/2004 | Kondo et al. | |
| 6,727,522 B1 | 4/2004 | Kawasaki et al. | |
| 6,784,007 B2 | 8/2004 | Iwasaki et al. | |
| 6,794,275 B2 | 9/2004 | Kondo et al. | |
| 6,812,499 B2 | 11/2004 | Kondo et al. | |
| 6,835,888 B2 | 12/2004 | Sano et al. | |
| 6,855,621 B2 | 2/2005 | Kondo et al. | |
| 6,858,308 B2 | 2/2005 | Kondo et al. | |
| 6,982,217 B2 | 1/2006 | Imada et al. | |
| 7,001,460 B2 | 2/2006 | Saito et al. | |
| 7,064,263 B2 | 6/2006 | Sano et al. | |
| 7,064,346 B2 | 6/2006 | Kawasaki et al. | |
| 7,087,831 B2 | 8/2006 | Den et al. | |
| 7,145,174 B2 | 12/2006 | Chiang et al. | |
| 7,282,132 B2 | 10/2007 | Iwata et al. | |
| 7,319,069 B2 | 1/2008 | Den et al. | |
| 7,872,259 B2 | 1/2011 | Den | |
| 7,973,313 B2 | 7/2011 | Arai et al. | |
| 8,193,532 B2 | 6/2012 | Arai et al. | |
| 2005/0199959 A1* | 9/2005 | Chiang et al. | 257/368 |
| 2005/0275038 A1* | 12/2005 | Shih et al. | 257/382 |
| 2006/0108636 A1 | 5/2006 | Sano et al. | |
| 2006/0110867 A1 | 5/2006 | Yabuta et al. | |
| 2006/0113549 A1 | 6/2006 | Den | |
| 2006/0113565 A1 | 6/2006 | Abe et al. | |
| 2007/0051926 A1* | 3/2007 | Nakayama et al. | 252/500 |
| 2007/0090365 A1 | 4/2007 | Hayashi et al. | |
| 2007/0194379 A1 | 8/2007 | Hosono et al. | |
| 2008/0032106 A1* | 2/2008 | Nakayama et al. | 428/216 |
| 2009/0189153 A1* | 7/2009 | Iwasaki et al. | 257/43 |
| 2011/0017996 A1 | 1/2011 | Den | |

FOREIGN PATENT DOCUMENTS

| | | |
|---|---|---|
| JP | 2000-150900 A | 5/2000 |
| JP | 2003-309117 A | 10/2003 |
| JP | 2004-193446 A | 7/2004 |
| JP | 2004-282050 A | 10/2004 |
| JP | 2005-347215 | 12/2005 |
| JP | 2006-165529 A | 6/2006 |
| JP | 2006-165531 A | 6/2006 |
| JP | 2006-165532 A | 6/2006 |
| JP | 2006-186319 | 7/2006 |
| WO | 2005/088726 A1 | 9/2005 |
| WO | WO 2005083722 A1 * | 9/2005 |
| WO | WO 2005122186 A1 * | 12/2005 |
| WO | 2006/051994 | 5/2006 |
| WO | 2006/051994 A2 | 5/2006 |
| WO | WO 2006051994 A2 * | 5/2006 |

OTHER PUBLICATIONS

PCT International Search Report and Written Opinion of the International Searching Authority, mailed Nov. 5, 2007, in PCT/JP2007/065114.

U.S. Appl. No. 12/089,907, International Filing Date Nov. 1, 2006, Toshiaki Aiba, et al.

Taiwanese Office Action dated Mar. 30, 2012 in Taiwanese Application No. 096127354.

Taiwan Office Action dated Sep. 27, 2011 issued during prosecution of related Taiwan application No. 096127354.

* cited by examiner (FIRST STEP): FORM ON THE SUBSTRATE AN OXIDE FILM INCLUDING AT LEAST ONE ELEMENT SELECTED FROM In AND Zn AND HAVING THE FIRST RESISTIVITY.

(SECOND STEP): CONVERT THE FIRST RESISTIVITY TO THE SECOND RESISTIVITY BY HEAT-TREATING, IN AN OXIDATIVE ATMOSPHERE, THE OXIDE FILM FORMED IN THE FIRST STEP TO INCREASE THE RESISTIVITY.

PRODUCTION METHOD OF THIN FILM TRANSISTOR USING AMORPHOUS OXIDE SEMICONDUCTOR FILM

TECHNICAL FIELD

The present invention relates to a production method of a thin film transistor using an amorphous oxide semiconductor film.

BACKGROUND ART

Recently, semiconductor devices using metal oxide semiconductor thin films have attracted attention. For example, as discussed in Japanese Patent Application Laid-Open No. 2000-150900, the above-mentioned thin films are characterized by being able to be formed at low temperatures, and having a large optical band gap so as to be transparent to visible light. Thus, a flexible and transparent thin film transistor (TFT) can be formed on plastic substrates, film substrates, and the like.

Generally, the oxide semiconductor films used as TFT active layers have hitherto been formed in an atmosphere with oxygen gas introduced thereinto for the purpose of controlling the electrical characteristics of the films. For example, WO2005-088726 A1 discusses a thin film transistor (TFT) in which an n-type oxide semiconductor including In—Ga—Zn—O is used for the channel layer, and ITO is used for the source and drain electrodes; in this TFT, by controlling the oxygen partial pressure of the film formation atmosphere in which the In—Ga—Zn—O film is formed, the carrier concentration has been controlled and a high carrier mobility has been obtained.

Additionally, Japanese Patent Application Laid-Open Nos. 2006-165529 and 2006-165532 discuss techniques for annealing in an oxidative atmosphere the active layers in the semiconductor devices using as the active layers thereof the oxide semiconductor films.

However, the oxide semiconductor films discussed in the above-mentioned patent documents are narrow in the oxygen partial pressure range (optimal oxygen partial pressure) under which the In—Ga—Zn—O films usable as the TFT active layers can be obtained, for example, as shown in WO2005-088726 A1. Additionally, there has been a problem such that the value of the optimal oxygen partial pressure is varied depending on the film formation conditions. Further, the present inventors have found that when In—Ga—Zn—O films are formed by a sputtering method in an atmosphere with oxygen introduced thereinto, the electrical characteristics of the formed In—Ga—Zn—O films are varied depending on the distance from the target. This is conceivably because the dissociation degree of the oxygen molecules present in the vapor phase is largely varied depending on the distance from the target.

Additionally, a TFT adopting as the channel layer thereof an In—Ga—Zn—O film fabricated in the film formation atmosphere with oxygen introduced thereinto can hardly attain such transistor characteristics as anticipated from the physical characteristics intrinsically possessed by the In—Ga—Zn—O film. Specifically, it is necessary to further improve the TFT characteristics such as the subthreshold characteristics in the subthreshold region and the field-effect mobility.

Further, when a DC stress of a voltage of 12 V is applied for 400 seconds to each of the gate electrode and the source and drain electrodes, the characteristic variations such as the turn-on characteristic degradation and threshold voltage variation are caused, and thus the DC stress affects the TFT. The main cause for the degradation of the TFT characteristics is conceivably ascribable to the damage to the semiconductor film effected by the oxygen ions generated from the oxygen introduced into the film formation atmosphere. Specifically, when the film formation is conducted by using a sputtering method, conceivably the oxygen introduced into the atmosphere increases the amount of the oxygen negative ions generated on the target surface, and consequently, the amount of the high energy oxygen negative ions incident onto the substrate is increased to cause the film quality degradation.

Additionally, the present inventors have fabricated and studied a thin film transistor (TFT) adopting as the channel layer thereof an In—Ga—Zn—O amorphous oxide thin film, and consequently, have found that the TFT is atmosphere sensitive in such a way that the characteristics of the TFT are varied by the atmospheres during operation and storage.

The fabricated device was placed in a vacuum chamber, and the electrical conductivity was measured while the chamber was being evacuated, and consequently a phenomenon was found that the measured value decreased gradually with decreasing pressure. When measured in a usual atmosphere, the measured value of the electrical conductivity was found to be stable.

Such an atmosphere-induced variation of the electrical conduction is also seen, for example, for ZnO, indium tin oxide (ITO) and the like; such a variation is conceivably due to the adsorption and desorption, to and from the conductive oxide, of the water and other gaseous molecules in the atmosphere. Thus, there has been caused a problem that an atmospheric variation induces variation in electrical conductivity to destabilize the TFT operation and consequently no reliability as a device can be attained.

Additionally, the present inventors have found a problem that in the formation of an oxide insulator by sputtering on an In—Ga—Zn—O amorphous oxide thin film, the film formation in an atmosphere without oxygen contained therein causes a large variation of the electrical characteristics of the oxide semiconductor so as to prohibit the attainment of satisfactory TFT characteristics.

The present invention solves the above-mentioned problems, and an object of the present invention is to provide a production method of an oxide thin film transistor having a wide process margin, excellent characteristics and high reliability.

Additionally, another object of the present invention is to provide a production method of a thin film transistor having high reliability attained by overcoming the TFT characteristic instability ascribable to the atmosphere variation.

Additionally, yet another object of the present invention is to provide a production method of a thin film transistor in which when an oxide insulator is formed on an In—Ga—Zn—O amorphous oxide thin film, the electrical characteristics of the oxide semiconductor are not varied.

DISCLOSURE OF THE INVENTION

The present invention intends to solve the above-mentioned problems, and the gist of the present invention is a production method of a thin film transistor including an active layer including an amorphous oxide semiconductor film including at least one element of In and Zn, the production method including a step of:

forming the active layer including:
a first step of forming the oxide film in an atmosphere having an introduced oxygen partial pressure of $1 \times 10^{-3}$ Pa or less; and a second step of annealing the oxide film in an oxidative atmosphere.

Additionally, an aspect of the present invention is a production method of a thin film transistor including an active layer including an amorphous oxide semiconductor film including at least one element of In and Zn, the production method including:
- a first step of forming the oxide film having a first resistivity; and
- a second step of converting the resistivity of the oxide film to a second resistivity by annealing in an oxidative atmosphere;
- wherein the second resistivity is higher than the first resistivity.

Additionally, another aspect of the present invention is a production method of a thin film transistor including an active layer including an amorphous oxide semiconductor film including at least one element of In and Zn, the production method including:
- a first step of forming the oxide film having a first activation energy; and
- a second step of converting the activation energy of the oxide film to a second activation energy by annealing in an oxidative atmosphere;
- wherein the second activation energy is higher than the first activation energy.

Additionally, yet another aspect of the present invention is a production method of a thin film transistor including an active layer including an amorphous oxide semiconductor film including at least one element of In and Zn, the production method including:
- a first step of forming the active layer;
- a second step of annealing in an oxidative atmosphere; and
- a third step of forming an oxide insulating layer on the active layer.

BEST MODE FOR CARRYING OUT THE INVENTION

Hereinafter, the embodiments of the present invention are described with reference to the accompanying drawings.

Figure 1:
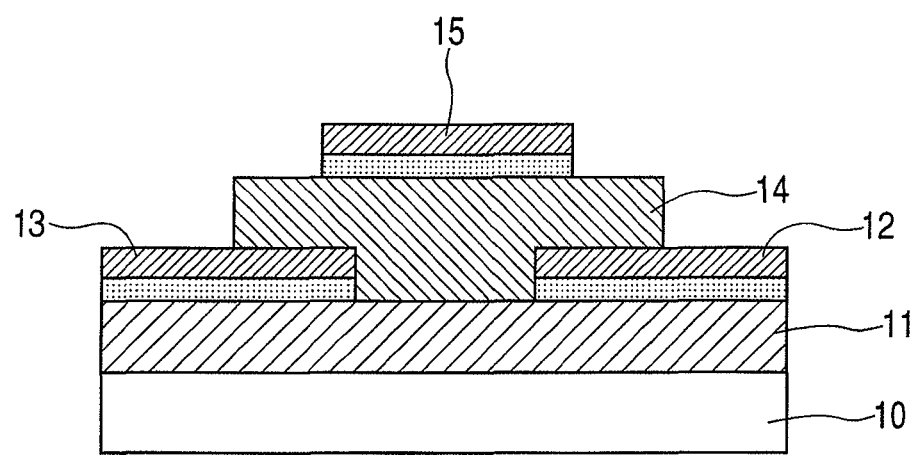
FIG. 1 is a view (sectional view) illustrating an example of a structure of a thin film transistor of the present invention.

FIG. 1 shows a schematic view of a structure of a TFT device fabricated in a present embodiment. The TFT device is constructed by disposing a channel layer 11 on a substrate 10, and by disposing a source electrode 12, a drain electrode 13, a gate insulating film 14 and a gate electrode 15 on the channel layer 11.

The semiconductor device structure applicable to the present invention is not limited to the above-mentioned staggered (top gate) structure TFT; for example, the inversely staggered (bottom gate) structure TFT in which the gate insulating film and the semiconductor channel layer are disposed in this order on the gate electrode may also be applicable.

According to the knowledge of the present inventors, desirably a thin film transistor in which an oxide film semiconductor layer including at least one element of In and Zn is used as the active layer (also referred to as channel layer) satisfies the following characteristics although the characteristics depend on the composition of the transistor. Specifically, satisfactory TFT characteristics can be obtained when there is used a semi-insulating oxide film in which the electrical resistivity (second resistivity) falls within a range of approximately 1 $\Omega$cm or more and 10 k$\Omega$cm ($1\times10^4$ $\Omega$cm) or less, or the activation energy (second activation energy) at room temperature falls within a range of approximately 50 meV or more and 400 meV or less. The activation energy as referred to herein means the activation energy of the oxide semiconductor film obtained from the Arrhenius plot of the electrical conductivity. For example, when the electrical resistivity is 1 $\Omega$cm or less, or the activation energy is 50 meV or less, no normally-off transistor can be formed; additionally, the on-off ratio cannot be made large, including an extreme case in which even application of the gate voltage cannot make the current between the source and drain electrodes be turned on or off so as to inhibit transistor operation. On the other hand, when the electrical resistivity is 10 k$\Omega$cm or more or the activation energy is 400 meV or more, the on-current cannot be made large, including an extreme case in which even application of the gate voltage cannot make the current between the source and drain electrodes be turned on or off so as to inhibit transistor operation, as the case may be.

Figure 6:
FIG. 6 is a diagram illustrating a step of forming a channel layer in a production method of a thin film transistor of the present invention.
Figure 8:
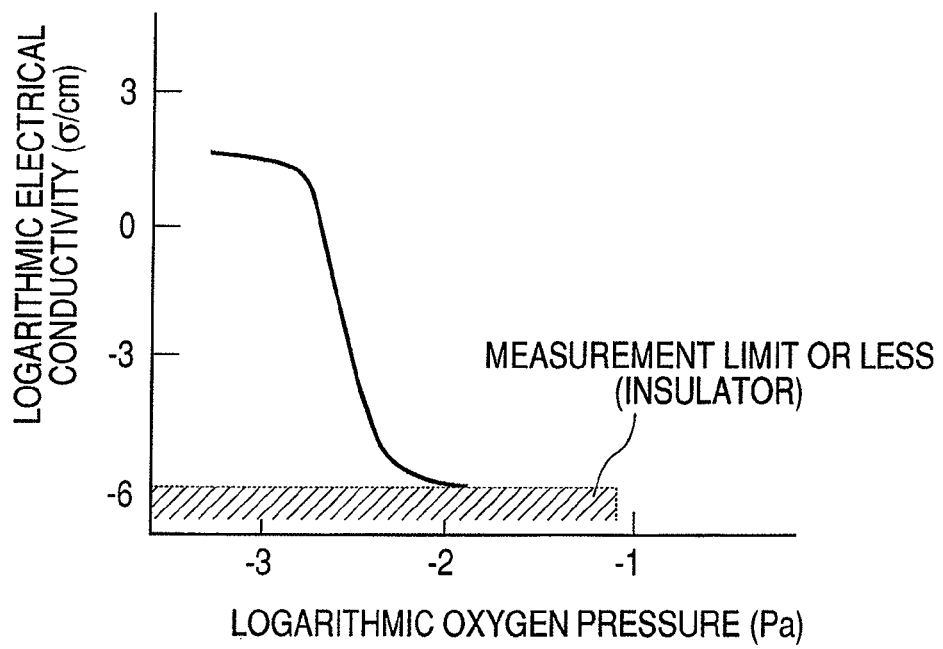
FIG. 8 is a graph showing a relation between the electron carrier concentration and the oxygen partial pressure during film formation in an In—Ga—Zn—O amorphous oxide.

The electrical resistivity and the carrier concentration of an oxide can be controlled by the introduced oxygen partial pressure at the time of film formation. This means that the oxygen defect amount in the thin film is mainly controlled by controlling the oxygen partial pressure, and consequently the electron carrier concentration is controlled. FIG. 8 is a graph showing an example of the oxygen partial pressure dependence of the carrier concentration when an In—Ga—Zn—O oxide thin film was formed by a sputtering method. However, as shown in FIG. 6, the resistivity of the metal oxide film of the present invention is controlled by firstly forming a film as a TFT active layer under the conditions leading to a low resistance (the first step) and then, by subjecting the film thus obtained to an annealing in an oxidative atmosphere (the second step).

Hereinafter, a formation method of the channel layer in the present invention is described in detail.

First, a substrate 10 made of glass or the like is prepared, and a metal oxide film is formed by means of vapor phase methods such as sputtering, pulse laser deposition, atomic layer deposition and electron beam deposition, or combinations thereof. In this film formation (the first step), the film is formed under the conditions that the electrical resistivity of the metal oxide film is made lower than the resistivity required for exhibiting satisfactory characteristics as the TFT channel layer. Fundamentally, such a metal oxide film is actualized by setting the introduced oxygen partial pressure to fall within a range of $1 \times 10^{-3}$ Pa or less although the conditions are dependent on the composition of the metal oxide film and the film formation apparatus to be used. In particular, when the introduced oxygen partial pressure is 0 Pa, such a metal oxide film can be easily actualized. Accordingly, the introduced oxygen partial pressure of the present invention is ideally 0 Pa, thus no lower limit being involved.

The introduced oxygen partial pressure as referred to herein means the partial pressure of the oxygen intentionally introduced into the interior of a film formation apparatus through a flow rate controller, not including the oxygen due to contamination such as the oxygen inevitably emitted from the internal wall and the like of the film formation apparatus, the oxygen entering from the outside because of the leakage of the film formation apparatus, and the oxygen emitted from the target. Needless to say, under such conditions that the residual oxygen gas pressure exceeds the upper limit of the above-mentioned introduced oxygen partial pressure, the advantageous effects of the present invention can hardly be attained, and hence the back pressure of the film formation apparatus to be used in the present invention is desirably $1 \times 10^{-3}$ Pa or less. It is to be noted that as the above-mentioned flow rate controller, for example, a mass flow controller can be used.

In this connection, from the viewpoints of the performances and stability of the TFT device, it is desirable to form the film under the conditions that the resistivity (the first resistivity) of the metal oxide film is made to be 1 $\Omega$cm or less, or the activation energy (the first activation energy) in the vicinity of room temperature is made to be 50 meV or less. It is to be noted that the lower limit of the resistivity of the metal oxide film on completion of the film formation is set, for example, at $1 \times 10^{-4}$ $\Omega$cm or more, and the lower limit of the activation energy is set, for example, at 0 meV, although these lower limits depend on the composition and the film formation conditions of the oxide film. Accordingly, the first resistivity of the present invention is desirably $1 \times 10^{-4}$ $\Omega$cm or more and 1 $\Omega$cm or less, and the first activation energy of the present invention is desirably 0 meV or more and 50 meV or less.

Thereafter, the metal oxide film thus fabricated is subjected to an annealing in an oxidative atmosphere (the second step) to form the channel layer. In this case, the annealing conditions are set so that the metal oxide film has such resistivity that enables the metal oxide film to exhibit satisfactory characteristics as the TFT channel layer. For the purpose of effectively controlling the resistivity, it is recommended that the annealing is conducted by setting the temperature range in the atmosphere including oxygen as the constituent element thereof in the form of the atmosphere of oxygen, ozone, water vapor or nitrogen oxides to fall within a temperature range of 250° C. or higher and 450° C. or lower, and desirably 250° C. or higher and 350° C. or lower. Additionally, it is effective to use ozone irradiation and oxygen radical irradiation, wherein the annealing temperature can be made as low as down to 150° C. In this case, it is also a desirable mode to conduct the irradiation of ultraviolet light in ozone.

When the channel layer is formed according to the above-mentioned method, it is not necessary to precisely control the oxygen partial pressure in the film formation atmosphere because the electrical resistivity is determined by the annealing conducted after the formation of the metal oxide semiconductor film. Additionally, the metal oxide film is formed under the conditions that the metal oxide film has a low resistivity, namely, in a film formation atmosphere in which oxygen radicals and high energy oxygen negative ions are small in amount. Consequently, the electrical characteristics of the fabricated film are not varied largely as a function of the distance from the target and hence the process margin can be widened. In particular, when a metal oxide film is formed by a sputtering method, the above-mentioned effects are made remarkable; this is conceivably because the dissociation degrees of molecular gases in the vapor phase are higher as compared to other vapor phase methods.

Next, hereinafter, a production method of forming the oxide insulator protection layer (the third step) of the present invention is described.

The third step is described with reference to the inversely staggered (bottom gate) TFT illustrated in FIG. 7. It is to be noted that as for a TFT structure, a staggered (top gate) TFT may also be used.

In the case of an inversely staggered TFT, the gate insulating layer made of an oxide insulator is formed beneath the channel layer, and hence it is not necessary to form the inversely staggered TFT by a sputtering method in an oxygen-including atmosphere; however, the oxide insulator protection layer is formed on the channel layer, and is accordingly required to be formed by a sputtering method in an oxygen-including atmosphere.

Additionally, in the case of a staggered TFT, the gate insulating layer made of an oxide insulator is formed on the channel layer, and is accordingly required to be formed by a sputtering method in an oxygen-including atmosphere.

Figure 7:
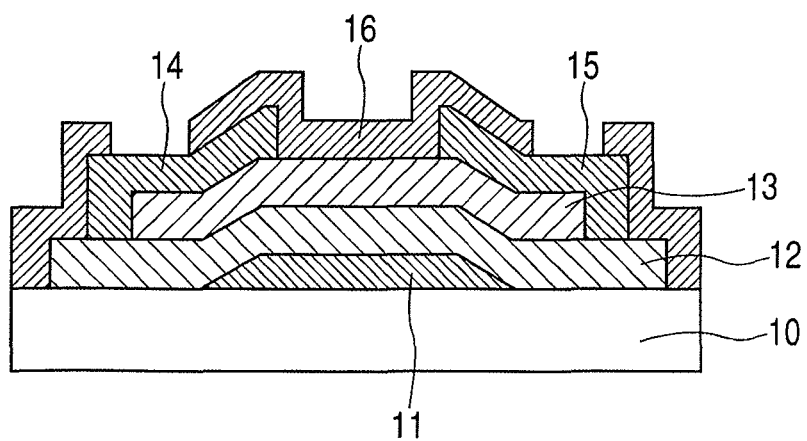
FIG. 7 is a sectional view of an inversely staggered TFT.

FIG. 7 is a sectional view schematically depicting a substrate 10, a gate electrode 11, and a gate insulating layer 12, a channel layer 13, a source electrode 14, a drain electrode 15 and a protection layer 16.

(Gate Insulating Layer)

In the present invention, it is desirable to use $SiO_2$ for the gate insulating layer. Alternatively, it is also desirable to use a material including at least one of $SiO_2$, $Y_2O_3$, $Al_2O_3$, $HfO_2$ and $TiO_2$ for the gate insulating layer; any of the films in which these oxides are laminated may also be used.

As the film formation method for the gate insulating layer 12, it is recommended to use vapor phase methods such as sputtering, pulse laser deposition and electron beam deposition. However, the film formation method is not limited to these methods.

(Electrodes)

The materials for the source electrode, the drain electrode and the gate electrode are not particularly constrained as long as the materials ensure satisfactory electrical conductance and satisfactory electrical connection to the channel layer. For example, usable are transparent conductive films respectively made of $In_2O_3$:Sn and ZnO, and metal films of Au, Pt, Al and Ni. Additionally, for the purpose of improving adhesion, a layer made of Ti, Ni, Cr and the like may be disposed between the channel layer or the insulating layer and the electrodes.

(Substrate)

As the substrate, a glass substrate, a metal substrate, a plastic substrate, a plastic film and the like can be used, depending on the conditions of the annealing of the channel layer and others.

(Active Layer (Channel Layer))

The active layer (channel layer) is made of an amorphous oxide including at least one of In, Ga and Zn.

As the film formation method of the active layer (channel layer), it is recommended to use vapor phase methods such as sputtering, pulse laser deposition and electron beam deposition. However, the film formation method is not limited to these methods.

The film formation temperature of the active layer (channel layer) is set to be equal to or lower than the temperature of the annealing to be conducted before formation of the protection layer made of a metal oxide insulator layer.

The annealing temperature is desirably equal to or lower than the glass transition temperature; in the present invention, the desirable temperature range is set to be 150° C. or higher and 450° C. or lower. The annealing is recommended to be conducted at temperatures of 200° C. or higher and 350° C. or lower.

The annealing may be conducted either before or after the formation of the source electrode and the drain electrode to be formed on the active layer (channel layer).

(Protection Layer)

As the protection layer, a metal oxide film including at least one metal element is used. It is desirable to use for the protection layer a metal oxide film including, among metal oxides, at least one listed below:
$SiO_2$, $Al_2O_3$, $Ga_2O_3$, $In_2O_3$, MgO, CaO, SrO, BaO, ZnO, $Nb_2O_5$, $Ta_2O_5$, $TiO_2$, $ZrO_2$, $HfO_2$, $CeO_2$, $Li_2O$, $Na_2O$, $K_2O$, $Rb_2O$, $Sc_2O_3$, $Y_2O_3$, $La_2O_3$, $Nd_2O_3$, $Sm_2O_3$, $Gd_2O_3$, $Dy_2O_3$, $Er_2O_3$ and $Yb_2O_3$.

Alternatively, silicon nitroxide ($SiO_xN_y$) may also be used, in addition to these metal oxides.

As the method for forming the above-mentioned metal oxides or $SiO_xN_y$ as the protection layer on the TFT, a CVD method, a sputtering method and the like can be used. When the protection layer is formed by a sputtering method, the film formation is conducted during sputtering in an oxygen-including atmosphere. This is because a device with the protection layer formed, for example, in an Ar gas atmosphere is degraded in TFT characteristics as compared to before formation of the protection layer. The cause for the degradation of the TFT characteristics is conceivably the resistance decrease of the active layer (channel layer) caused by the carrier generation due to the oxygen release from the interface of the active layer (channel layer) during formation of the protection layer. Consequently, the film formation is required to be conducted in an oxygen-including atmosphere during sputtering the protection layer. The oxygen content in the total sputtering gas is desirably from 10% to 80%, and is more desirably 30% or more and 60% or less.

(TFT Characteristics)

Figure 2:
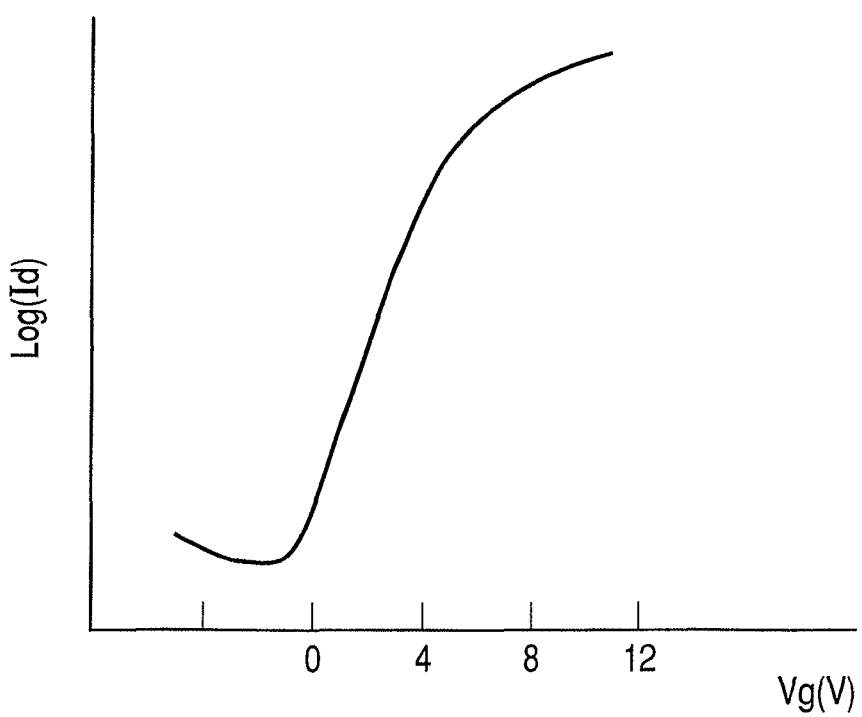
FIG. 2 is a graph showing a transfer characteristic of a thin film transistor fabricated in Example 1.

FIG. 2 shows the typical transfer characteristic (Vg-Id characteristic) of a TFT of the present invention. When a voltage Vd of 6 V is applied between the source and drain electrodes, by sweeping the gate voltage Vg between −5 V and 12 V, the current Id between the source and drain electrodes can be controlled (turned on and off). The on-current is higher and the obtained field-effect mobility is higher as compared to a TFT fabricated by the conventional method in which the resistivity is controlled by the introduced oxygen amount at the time of the metal oxide film formation. As compared to the TFT fabricated by the conventional method, the S value is reduced by a factor of 5 to 10, largely improving the subthreshold characteristics in the subthreshold region.

Figure 3A:
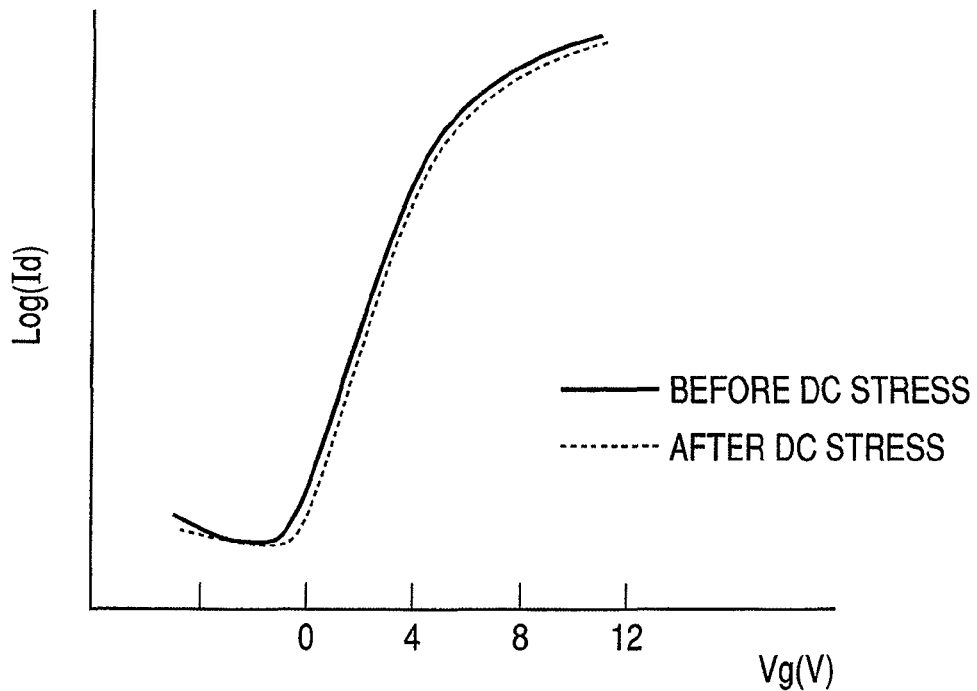
FIG. 3A is a graph showing the transfer characteristics of the thin film transistor fabricated in Example 1, before and after the application of a DC bias stress.
Figure 3B:
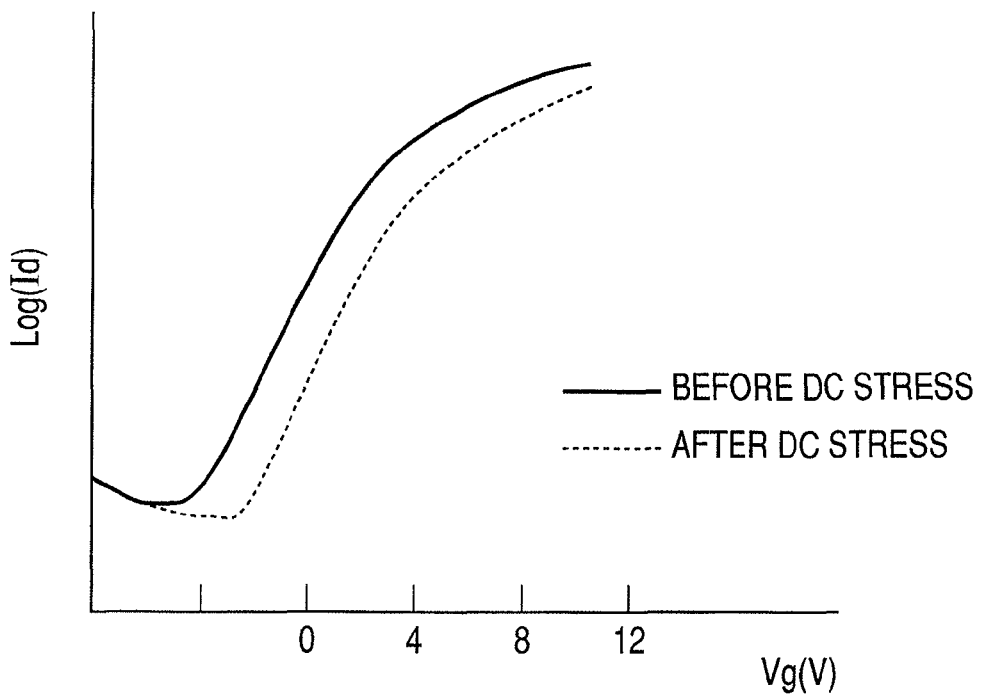
FIG. 3B is a graph showing the transfer characteristics of a thin film transistor fabricated in Comparative Example 1, before and after the application of a DC bias stress.

Next, the TFT of the present invention was subjected to a DC bias stress test. FIGS. 3A and 3B show the TFT transfer characteristic variations, typical in the present invention, between before and after the application of the DC stress of Vg=12 V and Vd=12 V for 400 seconds. Although the conventional TFT exhibited remarkable characteristic degradations such that the on-current was decreased and the threshold voltage was varied by a few V by the DC stress, the TFT of the present invention exhibited very small threshold voltage variations and is seen to be hardly affected by the DC stress.

This is conceivably because the metal oxide film to be used as the channel layer is formed under the conditions that the metal oxide film is made to have a low resistance, and accordingly the channel layer is actually formed so as to be small in plasma damage.

In particular, when the present invention is applied to a TFT in which, for the channel layer, used is an amorphous oxide free from grain boundary scattering and excellent in interface characteristics and accordingly having a high carrier mobility, a TFT having a large field-effect mobility and excellent characteristics can be actualized. In this case, the amorphous phase is stabilized by including at least one element of Ga and Sn in the oxide film. Additionally, from the viewpoint of the stabilization of the amorphous phase, it can be said that the temperature in the oxidative atmosphere at the time of the annealing is desirably set at 450° C. or lower.

Here, the state of being amorphous can be identified by the observation that no distinct diffraction peaks can be detected (in other words, halo patterns are observed) when X-ray is diffracted by a thin film, as a measurement target, with a low incidence angle of approximately 0.5 degree. It is to be noted that when the above-mentioned materials are used for the channel layer of a thin film transistor, the present invention does not exclude the case in which the channel layer includes microcrystalline-state constituent materials.

Additionally, according to the knowledge of the present inventors, it is also a desirable embodiment to use an amorphous oxide which includes In and Zn with an atomic composition ratio, In/(In+Zn), of 30 atom % or more and 45 atom % or less. Particularly when a TFT has such a channel layer, a TFT having a large mobility and being scarcely affected by the DC stress can be actualized.

EXAMPLES

Hereinafter, the present invention is described in more detail with reference to Examples.

Example 1

An embodiment of the TFT device of the present invention is described with reference to FIG. 1.

First, an In—Ga—Zn—O film was formed on a glass substrate 10 as a channel layer 11.

In present Example, the In—Ga—Zn—O film was formed by sputtering in an argon atmosphere and by annealing in the air.

As a target (a material source), a 2-inch sized sintered body having a composition of $InGaZnO_4$ was used, and the applied RF power was 100 W. The distance between the target and the substrate was approximately 9 cm. The In—Ga—Zn—O film was formed in an argon atmosphere of $3.5 \times 10^{-1}$ Pa with the introduced oxygen partial pressure of 0 Pa. The substrate temperature at the time of film formation was 25° C.

Next, the In—Ga—Zn—O film fabricated by a sputtering method was annealed in the ambient air atmosphere set at 300° C. for 1 hour. The obtained film was subjected to a four-probe measurement, and the following results were obtained: the In—Ga—Zn—O film before the annealing gave a resistivity and an activation energy of approximately 0.03 Ωcm and 0 meV, respectively, and on the other hand, the corresponding values after the annealing were approximately 500 Ωcm and 200 meV, respectively. Additionally, after the annealing at 300° C., the film surface was subjected to low incidence angle X-ray diffraction (thin film method, incidence angle: 0.5 degree) without detecting any distinct diffraction peaks, and hence the fabricated In—Ga—Zn—O film was identified to be an amorphous film. Further, a spectroscopic ellipsometric measurement was carried out and the pattern was analyzed, and consequently it was found that the root-mean-square roughness (Rrms) of the thin film was approximately 0.5 nm, and the film thickness was approximately 50 nm. The results of X-ray fluorescence (XRF) analysis showed that the metal composition ratio of the thin film was In:Ga:Zn=1.1:1.1:0.9.

Next, an approximately 5 nm thick Ti layer and an approximately 40 nm thick Au layer were laminated in this order so as for the Ti layer to be closer to the channel layer by using an electron beam heating deposition method, and then, a source electrode 12 and a drain electrode 13 were formed by using a photolithography method and a liftoff method. Then, a $SiO_2$ film to be used as a gate insulating film 14 was formed so as to have a thickness of approximately 90 nm by using an electron beam deposition method, then a Ti layer and a Au layer were sequentially laminated on the gate insulating layer 14, and a gate electrode 15 was formed by using a photolithography method and a liftoff method. The channel length and the channel width were found to be 50 μm and 200 μm, respectively.

Comparative Example 1

The same structure as in above-described Example 1 was adopted except for the channel layer. An In—Ga—Zn—O film was formed by a sputtering method in an argon-oxygen mixed gas atmosphere of $3.5 \times 10^{-1}$ Pa, when the introduced oxygen partial pressure was $5 \times 10^{-3}$ Pa. As a target, a 2-inch sized sintered body having the composition of $InGaZnO_4$ was used. The thickness of the In—Ga—Zn—O film was approximately 50 nm, and the substrate temperature at the time of film formation was 25° C. In present Comparative Example 1, the In—Ga—Zn—O film was formed exclusively by sputtering in the argon-oxygen mixed gas atmosphere, and no annealing in the ambient air atmosphere set at 300° C. was conducted after film formation. The film thus obtained was subjected to a four-probe measurement, and the resistivity of the In—Ga—Zn—O film was found to be approximately 700 Ωcm. Additionally, the fabricated In—Ga—Zn—O film was identified to be an amorphous film by X-ray diffraction. The results of X-ray fluorescence (XRF) analysis showed that the metal composition ratio of the thin film was In:Ga:Zn=1.1:1.1:0.9.

Comparative Example 2

The same structure as in above-described Example 1 was adopted except for the channel layer. An In—Ga—Zn—O film was formed by a sputtering method in an argon-oxygen mixed gas atmosphere of $3.5 \times 10^{-1}$ Pa, when the introduced oxygen partial pressure was $5 \times 10^{-3}$ Pa. As a target, a 2-inch sized sintered body having the composition of $InGaZnO_4$ was used. The thickness of the In—Ga—Zn—O film was approximately 50 nm, and the substrate temperature at the time of film formation was 25° C. In present Comparative Example 2, the In—Ga—Zn—O film was formed by a sputtering method in the argon-oxygen mixed gas atmosphere, and then an annealing in the ambient air atmosphere set at 300° C. was carried out. The film thus obtained was subjected to a four-probe measurement, and the resistivity of the In—Ga—Zn—O film was found to be approximately 500 Ωcm. Additionally, the fabricated In—Ga—Zn—O film was identified to be an amorphous film by X-ray diffraction. The results of X-ray fluorescence (XRF) analysis showed that the metal composition ratio of the thin film was In:Ga:Zn=1.1:1.1:0.9.

(Evaluation of Characteristics of TFT Device)

FIG. 2 is a graph showing the Id–Vg characteristic (transfer characteristic) at Vd=6 V of the TFT device fabricated in present Example when the measurement was carried out at room temperature. As compared to Comparative Example 1, the on-current was larger such that a current of approximately Id=$1 \times 10^{-4}$ A flowed at Vg=10 V. Additionally, the field-effect mobility was calculated from the output characteristics to yield a filed-effect mobility of approximately 7.8 $cm^2$/Vs in the saturation region, which was approximately 20% higher than that in Comparative Example 1. Further, the S value was approximately 0.28 V/decade to largely improve the subthreshold characteristics in the subthreshold region as compared to Comparative Example 1. The subthreshold characteristics in the subthreshold region were largely improved also as compared to Comparative Example 2 such that the S value was found to show a value approximately half that in Comparative Example 2. Additionally, the on-off ratio of the transistor was found to show a high value exceeding $10^9$.

Next, the TFT fabricated in present Example was subjected to the DC bias stress test. FIGS. 3A and 3B show the TFT transfer characteristics change between before and after the application of a DC stress of Vg=12 V and Vd=12 V for 400 seconds. FIG. 3A and FIG. 3B show the results of the DC bias stress test of the TFTs fabricated in present Example and Comparative Example 1, respectively. In the TFT of Comparative Example 1, the DC stress caused remarkable degradation of the characteristics including the decrease of the on-current and the threshold voltage variation of a few volts. Also in the TFT of Comparative Example 2, although the degradation of characteristics is smaller as compared to Comparative Example 1, a threshold voltage shift of approximately 1 V was observed. On the other hand, in the TFT of present Example, the threshold voltage variation was as very small as approximately 0.3 V, revealing that the TFT of present Example was hardly affected by the DC stress.

Example 2

An embodiment of the TFT device in the present invention is described with reference to FIG. 1.

First, an In—Ga—Zn—O film was formed as a channel layer 11 on a glass substrate 10.

In present Example, the In—Ga—Zn—O film was formed by a sputtering method in an argon atmosphere and by annealing in an oxygen atmosphere.

As a target (a material source), a 2-inch sized sintered body having the composition of $InGaZnO_4$ was used, and the applied RF power was 100 W. The distance between the target and the substrate was approximately 9 cm. The In—Ga—

Zn—O film was formed in an argon atmosphere of $3.5\times10^{-1}$ Pa with the introduced oxygen partial pressure of 0 Pa. The substrate temperature at the time of film formation was 25° C.

Next, the In—Ga—Zn—O film fabricated by a sputtering method was annealed in the oxygen atmosphere set at 280° C. for 30 minutes. The obtained film was subjected to a four-probe measurement, and the following results were obtained: the In—Ga—Zn—O film before the annealing gave a resistivity and an activation energy of approximately 0.03 Ωcm and 0 meV, respectively, and on the other hand, the corresponding values after the annealing were approximately 720 Ωcm and 210 meV, respectively.

Additionally, after the annealing at 280° C., the film surface was subjected to low incidence angle X-ray diffraction (thin film method, incidence angle: 0.5 degree) without detecting any distinct diffraction peaks, and hence the fabricated In—Ga—Zn—O film was identified to be an amorphous film. Further, a spectroscopic ellipsometric measurement was carried out and the pattern was analyzed, and consequently it was found that the root-mean-square roughness (Rrms) of the thin film was approximately 0.5 nm, and the film thickness was approximately 50 nm. The results of X-ray fluorescence (XRF) analysis showed that the metal composition ratio of the thin film was In:Ga:Zn=1.1:1.1:0.9.

Next, an approximately 5 nm thick Ti layer and an approximately 40 nm thick Au layer were laminated in this order so as for the Ti layer to be closer to the channel layer by using an electron beam heating deposition method, and then, a source electrode 12 and a drain electrode 13 were formed by a photolithography method and a liftoff method. Then, a $SiO_2$ film to be used as a gate insulating film 14 was formed so as to have a thickness of approximately 90 nm by using an electron beam deposition method, then a Ti layer and a Au layer were sequentially laminated on the gate insulating layer 14, and a gate electrode 15 was formed by using a photolithography method and a liftoff method. The channel length and the channel width were found to be 50 μm and 200 μm, respectively.

(Evaluation of Characteristics of TFT Device)

The evaluation of the characteristics of the TFT device was carried out at room temperature. Consequently, it was found that as compared to Comparative Example 1, the on-current of the TFT fabricated in present Example was larger such that a current of approximately $Id=1\times10^{-4}$ A flowed at Vg=10 V. Additionally, the field-effect mobility was calculated from the output characteristics to yield a filed-effect mobility of approximately 7.8 $cm^2$/Vs in the saturation region, which was approximately 20% higher than that in Comparative Example 1. Further, the S value was approximately 0.23 V/decade to largely improve the subthreshold characteristics in the subthreshold region as compared to Comparative Example 1. Additionally, the on-off ratio of the transistor was found to show a high value exceeding $10^9$.

Next, the TFT fabricated in present Example was subjected to the DC bias stress test. In the TFT of Comparative Example 1, the DC stress caused remarkable degradation of the characteristics including the decrease of the on-current and the threshold voltage variation of a few volts. On the other hand, in the TFT of present Example, the threshold voltage variation was as very small as approximately 0.2 V, revealing that the TFT of present Example was hardly affected by the DC stress.

Example 3

An embodiment of the TFT device in the present invention is described with reference to FIG. 1.

First, an In—Ga—Zn—O film was formed as a channel layer 11 on a glass substrate 10.

In present Example, the In—Ga—Zn—O film was formed by sputtering in an argon-oxygen mixed gas atmosphere and by annealing in the air.

As a target, a 2-inch sized sintered body having the composition of $InGaZnO_4$ was used, and the applied RF power was 100 W. The distance between the target and the substrate was approximately 9 cm. The In—Ga—Zn—O film was formed in an argon-oxygen mixed gas atmosphere of $3.5\times10^{-1}$ Pa with the introduced oxygen partial pressure of $8\times10^{-4}$ Pa. The substrate temperature at the time of film formation was 25° C.

Next, the In—Ga—Zn—O film fabricated by a sputtering method was annealed in the ambient air atmosphere set at 250° C. for 20 minutes. The obtained film was subjected to a four-probe measurement, and the following results were obtained: the In—Ga—Zn—O film before the annealing gave a resistivity and an activation energy of approximately 0.1 Ωcm and 5 meV, respectively, and on the other hand, the corresponding values after the annealing were approximately 600 Ωcm and 206 meV, respectively.

Additionally, after the annealing at 250° C., the film surface was subjected to low incidence angle X-ray diffraction (thin film method, incidence angle: 0.5 degree) without detecting any distinct diffraction peaks, and hence the fabricated In—Ga—Zn—O film was identified to be an amorphous film. Further, a spectroscopic ellipsometric measurement was carried out and the pattern was analyzed, and consequently it was found that the root-mean-square roughness (Rrms) of the thin film was approximately 0.5 nm, and the film thickness was approximately 50 nm. The results of X-ray fluorescence (XRF) analysis showed that the metal composition ratio of the thin film was In:Ga:Zn=1.1:1.1:0.9.

Next, an approximately 5 nm thick Ti layer and an approximately 40 nm thick Au layer were laminated in this order so as for the Ti layer to be closer to the channel layer by using an electron beam heating deposition method, and then, a source electrode 12 and a drain electrode 13 were formed by using a photolithography method and a liftoff method. Then, a $SiO_2$ film to be used as a gate insulating film 14 was formed so as to have a thickness of approximately 90 nm by using an electron beam deposition method, then a Ti layer and a Au layer were sequentially laminated on the gate insulating film 14, and a gate electrode 15 was formed by using a photolithography method and a liftoff method. The channel length and the channel width were found to be 50 μm and 200 μm, respectively.

(Evaluation of Characteristics of TFT Device)

The evaluation of the characteristics of the TFT device was carried out at room temperature. Consequently, it was found that as compared to Comparative Example 1, the on-current of the TFT fabricated in present Example was larger such that a current of approximately $Id=7\times10^{-5}$ A flowed at Vg=10 V. Additionally, the field-effect mobility was calculated from the output characteristics to be approximately 7.1 $cm^2$/Vs in the saturation region, as a value approximately 10% higher than that in Comparative Example 1. Further, the S value was approximately 0.32 V/decade to largely improve the subthreshold characteristics in the subthreshold region as compared to Comparative Example 1. Additionally, the on-off ratio of the transistor was found to show a high value exceeding $10^9$.

Next, the TFT fabricated in present Example was subjected to the DC bias stress test. In the TFT of Comparative Example 1, the DC stress caused remarkable degradation of the characteristics including the decrease of the on-current and the threshold voltage variation of a few volts. On the other hand, in the TFT of present Example, the threshold voltage variation was as very small as approximately 0.5 V, revealing that the TFT of present Example was hardly affected by the DC stress.

Example 4

An embodiment of the TFT device in the present invention is described with reference to FIG. 1.

First, an In—Ga—Zn—O film was formed as a channel layer 11 on a glass substrate 10.

In present Example, the In—Ga—Zn—O film was formed by sputtering in an argon atmosphere and by annealing in the air.

As a target, a 2-inch sized In—Ga—Zn—O sintered body having a metal composition ratio of In:Ga:Zn=30:15:55 was used, and the applied RF power was 100 W. The distance between the target and the substrate was approximately 9 cm. The In—Ga—Zn—O film was formed in an argon atmosphere of $3.5 \times 10^{-1}$ Pa, and the substrate temperature at the time of film formation was 25° C.

Next, the In—Ga—Zn—O film fabricated by a sputtering method was annealed in the ambient air atmosphere set at 300° C. for 1 hour.

The obtained film was subjected to a four-probe measurement, and the following results were obtained: the In—Ga—Zn—O film before the annealing gave a resistivity and an activation energy of approximately 0.01 Ωcm and 0 meV, respectively, and on the other hand, the corresponding values after the annealing in the ambient air atmosphere set at 300° C. were approximately 300 Ωcm and 190 meV, respectively.

Additionally, after the annealing of the In—Ga—Zn—O film, the film surface was subjected to low incidence angle X-ray diffraction (thin film method, incidence angle: 0.5 degree) without detecting any distinct diffraction peaks, and hence the fabricated In—Ga—Zn—O film was identified to be an amorphous film. Further, a spectroscopic ellipsometric measurement was carried out and the pattern was analyzed, and consequently it was found that the root-mean-square roughness (Rrms) of the thin film was approximately 0.5 nm, and the film thickness was approximately 50 nm. The results of X-ray fluorescence (XRF) analysis showed that the metal composition ratio of the thin film was approximately In:Ga:Zn=36:10:54.

Comparative Example 3

The same structure as in above-described Example 4 was adopted except for the channel layer. An In—Ga—Zn—O film was formed by a sputtering method in an argon-oxygen mixed gas atmosphere of $3.5 \times 10^{-1}$ Pa, when the introduced oxygen partial pressure was $1 \times 10^{-2}$ Pa. As a target, an In—Ga—Zn—O sintered body having a metal composition ratio of In:Ga:Zn=30:15:55 was used. The thickness of the In—Ga—Zn—O film was approximately 50 nm, and the substrate temperature at the time of film formation was 25° C. In present Comparative Example 3, the In—Ga—Zn—O film was formed exclusively by sputtering in the argon-oxygen mixed gas atmosphere, and no annealing in the ambient air atmosphere set at 300° C. was conducted after film formation. The film thus obtained was subjected to a four-probe measurement, and the resistivity thereof was found to be approximately 500 Ωcm. Additionally, the fabricated In—Ga—Zn—O film was identified to be an amorphous film by X-ray diffraction. The results of X-ray fluorescence (XRF) analysis showed that the metal composition ratio of the thin film was In:Ga:Zn=35:9:56.

(Evaluation of Characteristics of TFT Device)

The evaluation of the characteristics of the TFT device was carried out at room temperature. Consequently, it was found that as compared to Comparative Example 3, the on-current of the TFT fabricated in present Example was larger such that a current of approximately $Id=2.5 \times 10^{-4}$ A flowed at $Vg=10$ V. Additionally, the field-effect mobility was calculated from the output characteristics to be approximately 14.5 cm$^2$/Vs in the saturation region, as a value approximately 25% higher than that in Comparative Example 3. Further, the S value was as small as approximately 0.16 V/decade to exhibit satisfactory subthreshold characteristics in the subthreshold region. Additionally, the on-off ratio of the transistor was able to attain a high value exceeding $10^9$.

Next, the TFT fabricated in present Example was subjected to the DC bias stress test. In the TFT of Comparative Example 3, the DC stress caused degradation of the characteristics including the decrease of the on-current and the threshold voltage variation of approximately 1 V. On the other hand, in the TFT of present Example, neither the on-current variation nor the threshold voltage variation was observed, revealing that the TFT of present Example was hardly affected by the DC stress.

Example 5

An embodiment of the TFT device in the present invention is described with reference to FIG. 1.

First, an In—Ga—Zn—O film was formed as a channel layer 11 on a plastic substrate 10.

In present Example, the In—Ga—Zn—O film was formed by sputtering in an argon atmosphere and by annealing in an atmosphere in which ultraviolet light was irradiated in ozone.

As a target, a 2-inch sized In—Ga—Zn—O sintered body having a metal composition ratio of In:Ga:Zn=30:15:55 was used, and the applied RF power was 100 W. The distance between the target and the substrate was approximately 9 cm. The In—Ga—Zn—O film was formed in an argon atmosphere of $3.5 \times 10^{-1}$ Pa, and the substrate temperature at the time of film formation was 25° C.

Next, the In—Ga—Zn—O film fabricated by a sputtering method was annealed for 1 hour in the atmosphere set at 200° C. in which ultraviolet light was irradiated in ozone.

The obtained film was subjected to a four-probe measurement, and the following results were obtained: the In—Ga—Zn—O film before the annealing gave a resistivity of approximately 0.01 Ωcm, and on the other hand, the resistivity after the annealing in the atmosphere set at 200° C. in which ultraviolet light was irradiated in ozone was approximately 900 Ωcm. Additionally, after the annealing of the In—Ga—Zn—O film, the film surface was subjected to low incidence angle X-ray diffraction (thin film method, incidence angle: 0.5 degree) without detecting any distinct diffraction peaks, and hence the fabricated In—Ga—Zn—O film was identified to be an amorphous film. Further, a spectroscopic ellipsometric measurement was carried out and the pattern was analyzed, and consequently it was found that the root-mean-square roughness (Rrms) of the thin film was approximately 0.5 nm, and the film thickness was approximately 50 nm. The results of X-ray fluorescence (XRF) analysis showed that the metal composition ratio of the thin film was approximately In:Ga:Zn=36:10:54.

Comparative Example 4

The same structure as in above-described Example 5 was adopted except for the channel layer. An In—Ga—Zn—O film was formed by a sputtering method in an argon-oxygen mixed gas atmosphere of $3.5 \times 10^{-1}$ Pa, when the introduced oxygen partial pressure was $1 \times 10^{-2}$ Pa. As a target, an In—Ga—Zn—O sintered body having a metal composition ratio of In:Ga:Zn=30:15:55 was used. The thickness of the In—Ga—Zn—O film was approximately 50 nm, and the substrate temperature at the time of film formation was 25° C. In present Comparative Example 4, the In—Ga—Zn—O film was formed exclusively by sputtering in the argon-oxygen mixed gas atmosphere, and no annealing in the atmosphere set at 200° C. in which ultraviolet light was irradiated in ozone was conducted after film formation. The film thus obtained was subjected to a four-probe measurement, and the resistivity thereof was found to be approximately 500 Ωcm. Additionally, the fabricated In—Ga—Zn—O film was identified to be an amorphous film by X-ray diffraction. The results of X-ray fluorescence (XRF) analysis showed that the metal composition ratio of the thin film was In:Ga:Zn=35:9:56.

(Evaluation of Characteristics of TFT Device)

The evaluation of the characteristics of the TFT device was carried out at room temperature. Consequently, a filed-effect mobility of approximately 6.5 cm²/Vs was obtained in the saturation region, which was approximately 25% higher than that in Comparative Example 4. Additionally, the on-off ratio of the transistor was able to attain a high value exceeding $10^9$.

Next, the TFT fabricated in present Example was subjected to the DC bias stress test. In the TFT of Comparative Example 4, the DC stress caused degradation of the characteristics including the decrease of the on-current and the threshold voltage variation of a few volts. On the other hand, in the TFT of present Example, the threshold voltage variation was as small as 1 V or less, revealing that the TFT of present Example was hardly affected by the DC stress.

Example 6

An embodiment of the TFT device in the present invention is described with reference to FIG. 1.

First, an In—Zn—O film was formed as a channel layer 11 on a glass substrate 10.

In present Example, the In—Zn—O film was formed by sputtering in an argon atmosphere and by annealing in the air.

As a target, a 2-inch sized sintered body having a composition of $In_2Zn_3O_6$ was used, and the applied RF power was 100 W. The distance between the target and the substrate was approximately 9 cm. The In—Zn—O film was formed in an argon atmosphere of $3.5 \times 10^{-1}$ Pa with the introduced oxygen partial pressure of 0 Pa. The substrate temperature at the time of film formation was 25° C.

Next, the In—Zn—O film fabricated by a sputtering method was annealed in the ambient air atmosphere set at 300° C. for 1 hour.

The obtained film was subjected to a four-probe measurement, and the following results were obtained: the In—Zn—O film before the annealing gave a resistivity of approximately 0.005 Ωcm, and on the other hand, the resistivity after the annealing in the ambient air atmosphere set at 300° C. was approximately 30 Ωcm. Additionally, after the annealing of the In—Zn—O film, the film surface was subjected to low incidence angle X-ray diffraction (thin film method, incidence angle: 0.5 degree) without detecting any distinct diffraction peaks, and hence the fabricated In—Zn—O film was identified to be an amorphous film. Further, a spectroscopic ellipsometric measurement was carried out and the pattern was analyzed, and consequently it was found that the root-mean-square roughness (Rrms) of the thin film was approximately 0.5 nm, and the film thickness was approximately 50 nm. The results of X-ray fluorescence (XRF) analysis showed that the metal composition ratio of the thin film was approximately In:Zn=2:3.

Comparative Example 5

The same structure as in above-described Example 6 was adopted except for the channel layer. An In—Zn—O film was formed by a sputtering method in an argon-oxygen mixed gas atmosphere of $3.5 \times 10^{-1}$ Pa, when the introduced oxygen partial pressure was $1.5 \times 10^{-2}$ Pa. As a target, a 2-inch sized sintered body having the composition of $In_2Zn_3O_6$ was used. The thickness of the In—Zn—O film was approximately 50 nm, and the substrate temperature at the time of film formation was 25° C. In present Comparative Example 5, the In—Zn—O film was formed exclusively by sputtering in the argon-oxygen mixed gas atmosphere, and no annealing in the ambient air atmosphere set at 300° C. was conducted after film formation. The film thus obtained was subjected to a four-probe measurement, and the resistivity thereof was found to be approximately 50 Ωcm. Additionally, the fabricated In—Zn—O film was identified to be an amorphous film by X-ray diffraction. The results of X-ray fluorescence (XRF) analysis showed that the metal composition ratio of the thin film was In:Zn=2:3.

(Evaluation of Characteristics of TFT Device)

Figure 4:
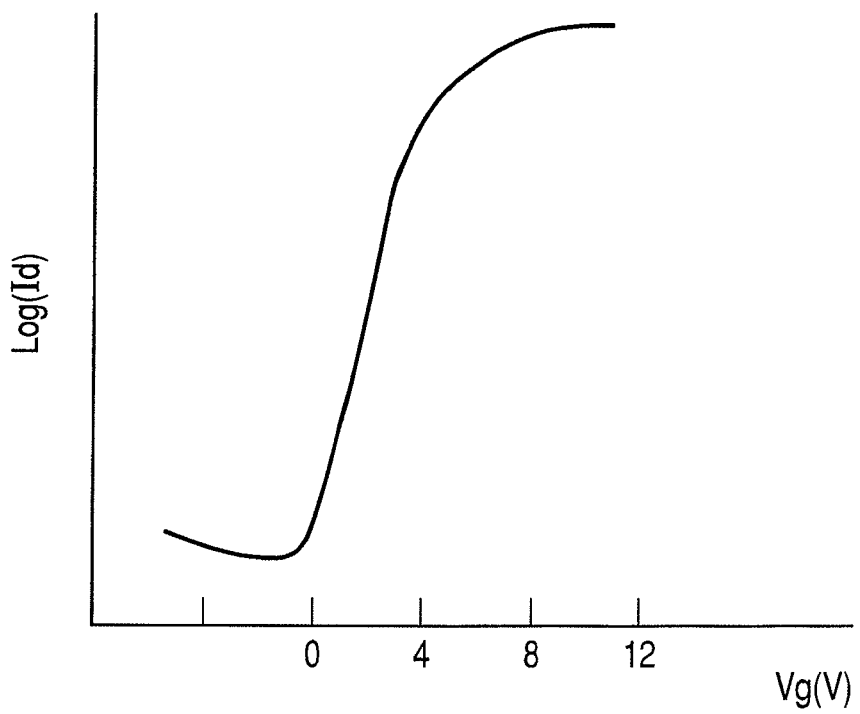
FIG. 4 is a graph showing a transfer characteristic of a thin film transistor fabricated in Example 6.

FIG. 4 is a graph showing the Id–Vg characteristic (transfer characteristic) at Vd=6 V of the TFT device fabricated in present Example when the measurement was carried out at room temperature. As compared to Comparative Example 5, the on-current was larger such that a current of approximately Id=$5 \times 10^{-4}$ A flowed at Vg=10 V. Additionally, the field-effect mobility was calculated from the output characteristics to be approximately 21 cm²/Vs in the saturation region, as a value approximately 35% higher than that in Comparative Example 5. Further, the S value was as small as approximately 0.2 V/decade to exhibit satisfactory subthreshold characteristics in the subthreshold region. Additionally, the on-off ratio of the transistor was able to attain a high value exceeding $10^9$.

Figure 5A:
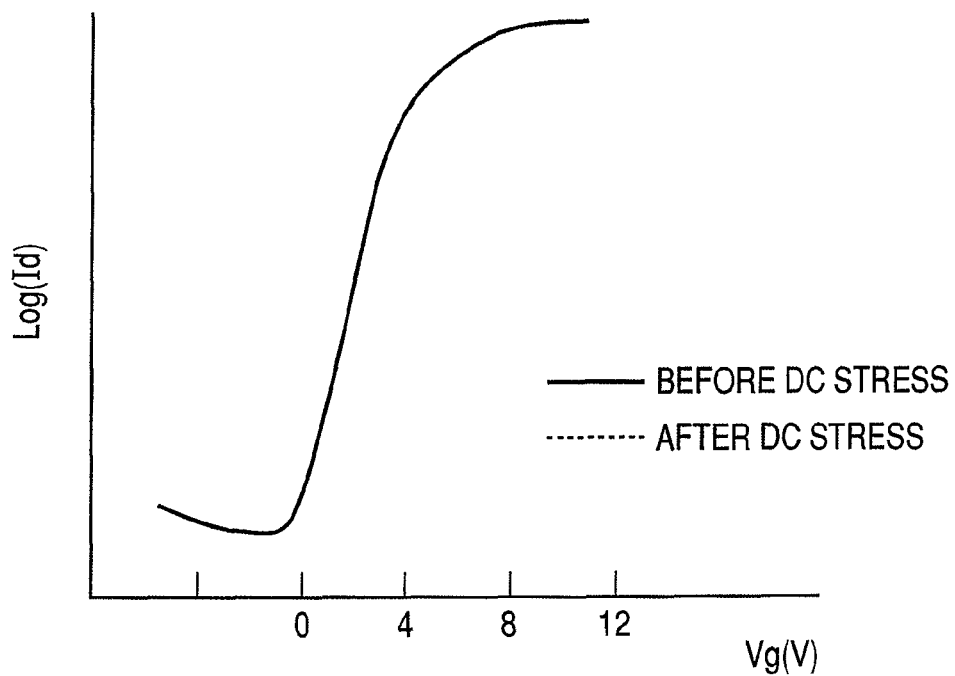
FIG. 5A is a graph showing the transfer characteristics of the thin film transistor fabricated in Example 6, before and after the application of a DC bias stress.
Figure 5B:
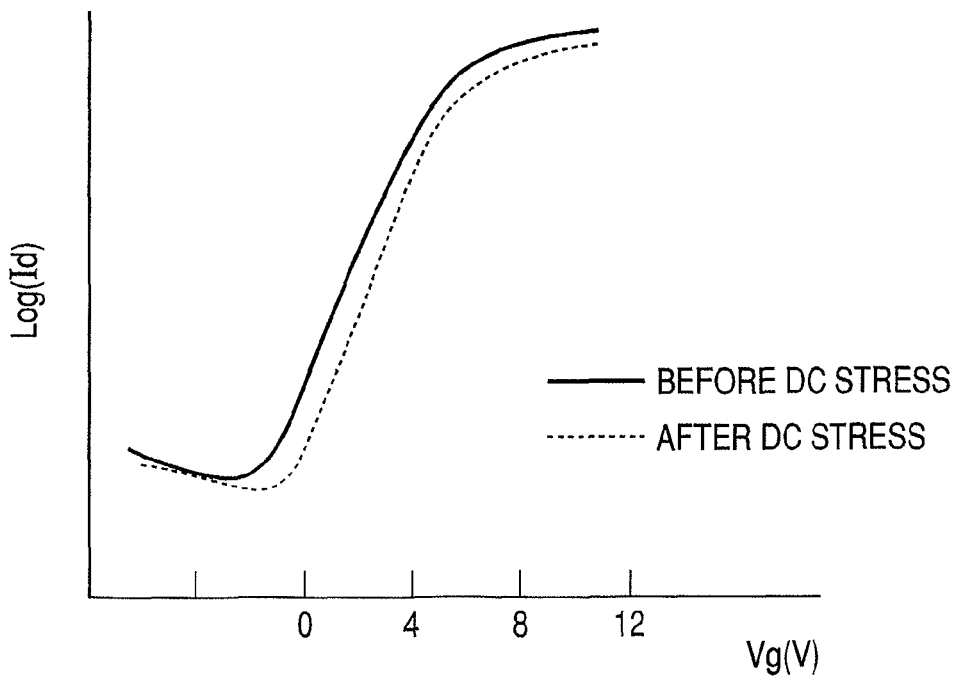
FIG. 5B is a graph showing the transfer characteristics of a thin film transistor fabricated in Comparative Example 5, before and after the application of a DC bias stress.

Next, the TFT fabricated in present Example was subjected to the DC bias stress test. FIGS. 5A and 5B show the TFT transfer characteristics change between before and after the application of a DC stress of Vg=12 V and Vd=12 V for 400 seconds. FIG. 5A and FIG. 5B show the results of the DC bias stress test of the TFTs fabricated in present Example and Comparative Example 5, respectively. In the TFT of Comparative Example 5, the DC stress caused degradation of the characteristics including the decrease of the on-current and the threshold voltage variation of approximately 1 V. On the other hand, in the TFT of present Example, neither the on-current variation nor the threshold voltage variation was observed, revealing that the TFT of present Example was hardly affected by the DC stress.

Example 7

(TFT Having Metal Oxide Protection Layer)

An inversely staggered TFT device shown in FIG. 7 was fabricated.

A Corning 1737 glass substrate was used as a substrate 10.

First, a 5 nm thick Ti layer, a 50 nm thick Au layer and another 5 nm thick Ti layer were laminated on the substrate 10 in this order by an electron beam deposition method. The laminated film was applied with a photolithography method and a liftoff method to form a gate electrode 11, wherein the Ti layers served as adhesive layers.

Further thereon, a 200 nm thick $SiO_2$ film was formed by a RF sputtering method to form a gate insulating layer 12.

Successively, with a polycrystalline sintered body having a composition of $InGaO_3(ZnO)$ as a target, a 40 nm thick In—Ga—Zn—O oxide semiconductor film was deposited as a channel layer 13 by a RF sputtering method.

In present Example, the applied RF power was 200 W. The atmosphere at the time of film formation was such that the total pressure was 0.5 Pa, and the gas flow rate ratio was $Ar:O_2$=95:5. The film formation rate was 8 nm/min, and the substrate temperature was 25° C.

The deposited In—Ga—Zn—O oxide semiconductor film was applied with a photolithography method and an etching method to be processed to an appropriate size.

At this stage, two devices were prepared; one of them was annealed in the air at 300° C. for 30 minutes, but the other was not annealed.

On each of the devices, a 5 nm thick Ti layer, a 50 nm thick Au layer and another 5 nm thick Ti layer were laminated in this order, and a source electrode 14 and a drain electrode 15 were formed by a photolithography method and a liftoff method.

Further thereon, a 100 nm thick $SiO_2$ film was deposited as a protection layer 16 by a RF sputtering method.

In present Example, the applied RF power was 400 W. The atmosphere at the time of film formation was such that the total pressure was 0.1 Pa, and the gas flow rate ratio was $Ar:O_2$=50:50. The film formation rate was 2 nm/min, and the substrate temperature was 25° C.

Finally, contact holes were formed by removing a portion on each of the gate electrode 11, the drain electrode 15 and the source electrode 14 by a photolithography method and an etching method.

In the manner as described above, the TFT devices were fabricated.

(Evaluation of Characteristics of TFT Device)

Figure 9:
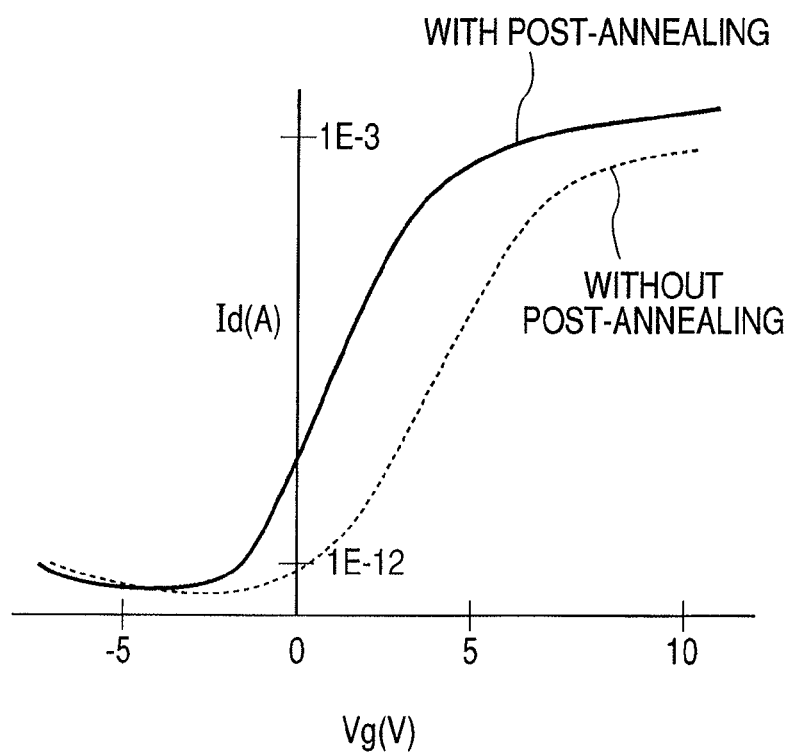
FIG. 9 is a graph showing the transfer characteristics of a TFT with and a TFT without application of an annealing embodied in the present invention.

FIG. 9 shows the transfer characteristics of the annealed device and the non-annealed device, measured at room temperature in the air after the protection layer formation.

The annealed device gave a drain current of approximately 1E-3 at the gate voltage Vg=10 V, and the field-effect mobility was calculated from the output characteristics to yield a field-effect mobility of approximately 20 $cm^2$/Vsin the saturation region.

The non-annealed device gave a drain current of approximately 1E-4 at the gate voltage Vg=10 V, and a field-effect mobility of approximately 5 $cm^2$/Vsin the saturation region.

As can be seen, the rise voltage of the annealed device was located in the negative region, but the TFT characteristics of the annealed device were better.

Figure 10:
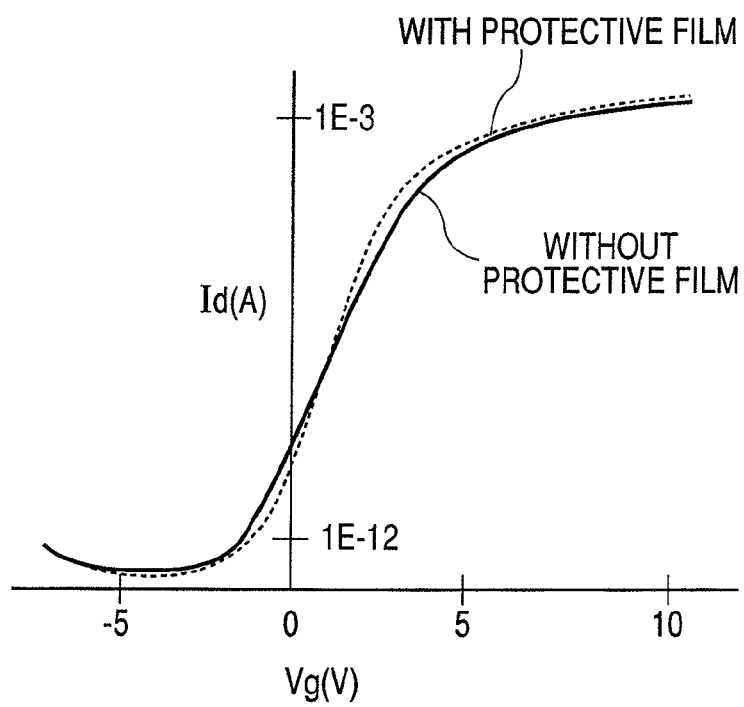
FIG. 10 is a graph showing the transfer characteristics of the TFT with application of the annealing embodied in the present invention, before and after the formation of a protection layer.
Figure 11:
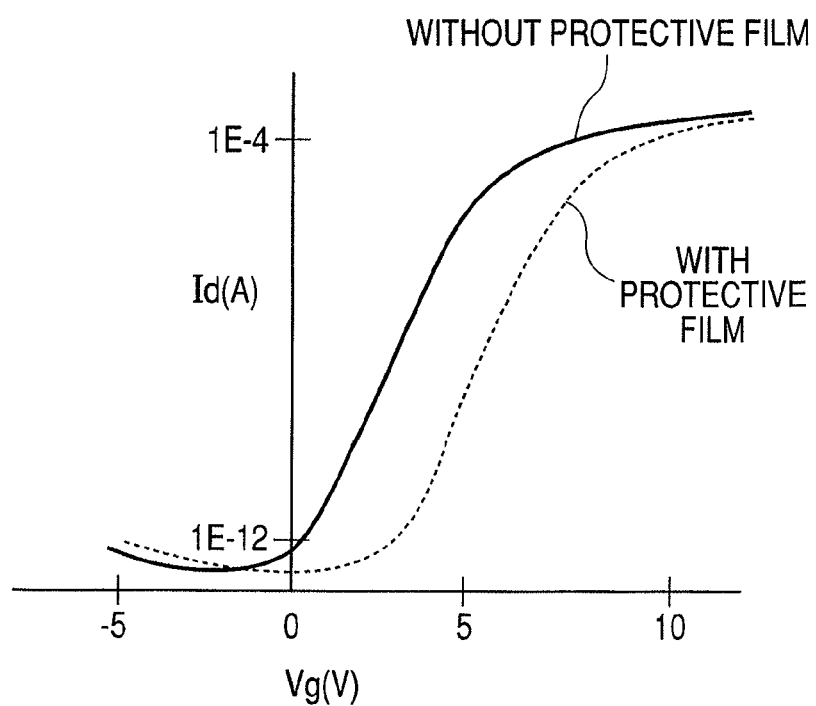
FIG. 11 is a graph showing the transfer characteristics of the TFT without application of the annealing embodied in the present invention, before and after the formation of a protection layer.

FIG. 10 shows the transfer characteristics of the annealed TFT device before and after formation of the protection layer. The rise was observed in the vicinity of 0 V in the device before formation of the protection layer, but was shifted to the vicinity of 3 V in the device with the protection layer formed thereon. The field-effect mobility was approximately 9 $cm^2$/Vsin the device before formation of the protection layer, but approximately 20 $cm^2$/Vsin the device with the protection layer formed thereon. Additionally, FIG. 11 shows the transfer characteristics of the non-annealed TFT device before and after formation of the protection layer. The rise observed in the vicinity of –2 V was steeper in the device with the protection layer formed thereon than that in the device before formation of the protection layer. The field-effect mobility was approximately 4 $cm^2$/Vs in the device before formation of the protection layer, but approximately 12 $cm^2$/Vs in the device with the protection layer formed thereon. The rise voltage was sifted to the positive direction in the non-annealed device by forming the protection layer, but was not shifted in the annealed device even by forming the protection layer. The cause of the rise voltage shift is conceivably ascribable to the effect due to the heat generated during sputtering. Accordingly, the heat effect exerted during sputtering was conceivably decreased in the annealed device by the annealing. Further, the fact that the formation of the protection layer increased the field-effect mobility both in the annealed device and in the non-annealed device is conceivably ascribable to the defect decrease in the channel layer interface due to oxygen plasma through film formation in the oxygen-including atmosphere.

Figure 12:
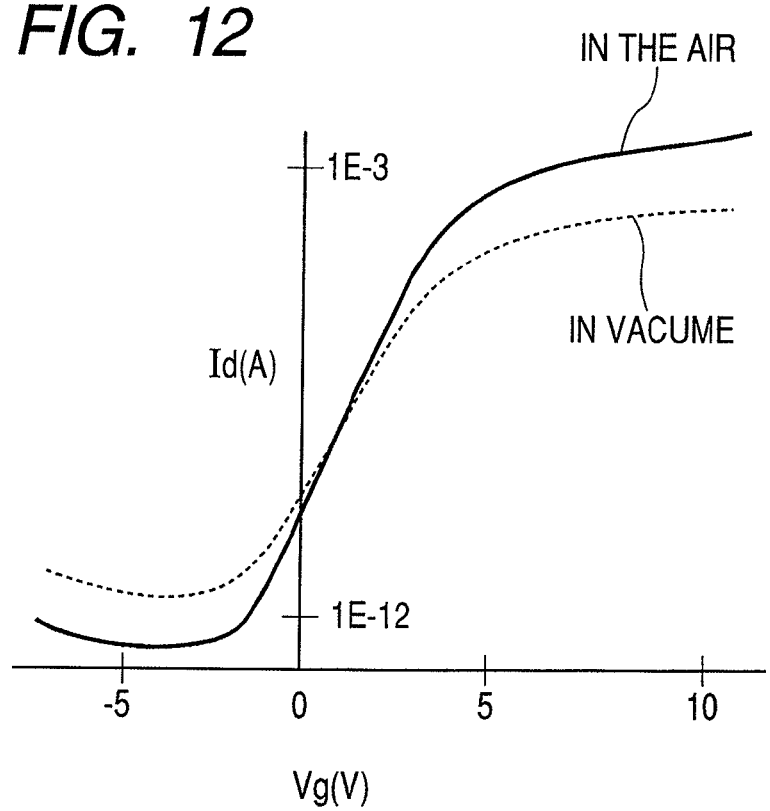
FIG. 12 is a graph showing the transfer characteristics, in the air and in a vacuum, of a TFT fabricated without formation of a protection layer embodied in the present invention.

Next, the devices with the protection layer formed thereon were placed in a vacuum chamber to be subjected to measurements in vacuum without finding any variations in characteristics. Additionally, in the measurements in the air, no variations in characteristics were found both in the device with the protection layer formed thereon and in the device without the protection layer. FIG. 12 shows the TFT device transfer characteristics in the air and in vacuum for the device without the protection layer formed thereon after the annealing; the measurements in vacuum gave a drain current of approximately 1E-4 at the gate voltage Vg=10 V and a field-effect mobility of approximately 1 $cm^2$/Vs in the saturation region, and the measurements in the air gave a drain current of approximately 1E-3, at the gate voltage Vg=10 V and a field-effect mobility of approximately 9 $cm^2$/Vs in the saturation region, revealing that in the absence of the protection layer, the environmental variation varies the characteristics. On the other hand, it has also been revealed that the formation of the protection layer stabilizes the characteristics even under the environmental variation.

As described above, the TFT using as the channel layer an amorphous oxide semiconductor can be fabricated as a TFT that retains satisfactory characteristics without being affected by the environmental variation, by annealing before forming the oxide insulator protection layer and by forming the oxide insulator protection layer in an oxygen-including atmosphere.

Example 8

(TFT with Metal Oxide Protection Layer Formed in an Atmosphere Including No Oxygen)

An inversely staggered TFT device shown in FIG. 7 was fabricated.

A Corning 1737 glass substrate was used as a substrate 10.

First, a 5 nm thick Ti layer, a 50 nm thick Au layer and another 5 nm thick Ti layer were laminated on the substrate 10 in this order by an electron beam deposition method. The laminated film was applied with a photolithography method and a liftoff method to form a gate electrode 11.

Further thereon, a 200 nm thick $SiO_2$ film was formed by a RF sputtering method to form a gate insulating film 12.

Successively, with a polycrystalline sintered body having the composition of $InGaO_3(ZnO)$ as a target, a 40 nm thick In—Ga—Zn—O oxide semiconductor thin film was deposited as a channel layer 13 by a RF sputtering method.

In present Example, the applied RF power was 200 W. The atmosphere at the time of film formation was such that the total pressure was 0.5 Pa, and the gas flow rate ratio was $Ar:O_2$=95:5. The film formation rate was 8 nm/min, and the substrate temperature was 25° C.

The deposited In—Ga—Zn—O oxide semiconductor thin film was applied with a photolithography method and an etching method to be processed to an appropriate size.

At this stage, annealing was carried out in the air at 300° C. for 30 minutes.

Further thereon, a 5 nm thick Ti layer, a 50 nm thick Au layer and another 5 nm thick Ti layer were laminated in this order, and a source electrode 14 and a drain electrode 15 were formed by a photolithography method and a liftoff method.

Further thereon, a 100 nm thick $SiO_2$ film was deposited as a protection layer 16 by a RF sputtering method.

In present Example, the applied RF power was 400 W. The atmosphere at the time of film formation was such that the total pressure was 0.1 Pa, and the atmospheric gas was Ar gas. The film formation rate was 7 nm/min, and the substrate temperature was 25° C.

Finally, contact holes were formed by removing a portion on each of the gate electrode 11, the drain electrode 15 and the source electrode 14 by a photolithography method and an etching method.

(Evaluation of Characteristics of TFT Device)

Figure 13:
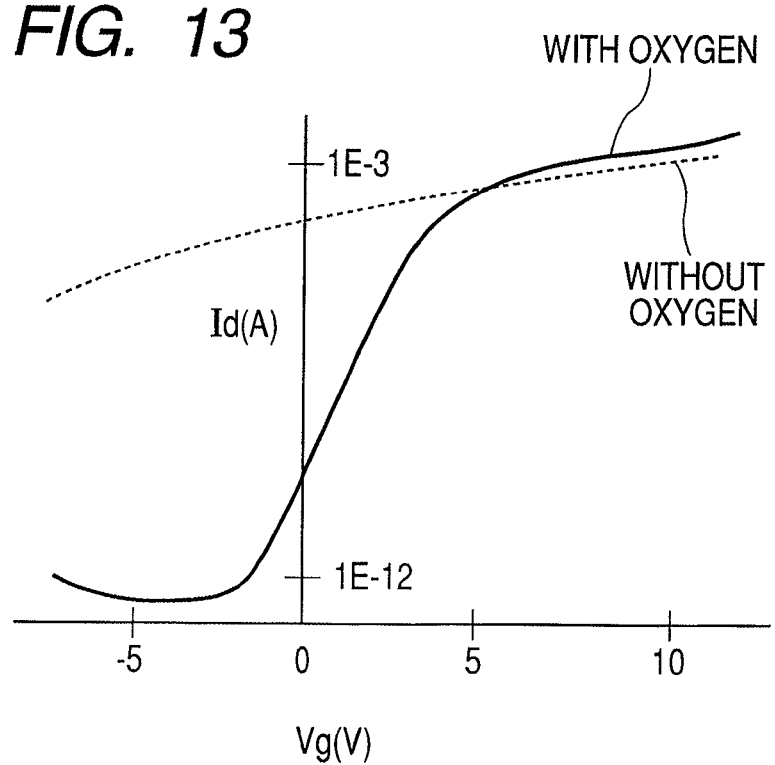
FIG. 13 is a graph showing the transfer characteristics of a TFT with a protection layer, embodied in the present invention, formed in an oxygen-including atmosphere and a TFT with a protection layer, embodied in the present invention, formed in an Ar atmosphere (without oxygen).

FIG. 13 shows the TFT device transfer characteristics of the device fabricated in Example 8 (with the protection layer formed in the absence of oxygen) and the device fabricated in Example 7 (with the protection layer formed in the presence of oxygen) under the same conditions as in Example 8 except for the protection layer. The device of Example 8 gave a drain current of approximately 1E-6 at a gate voltage Vg=−5 V; the characteristics of the device of Example 8 were largely varied as compared to the device of Example 7, so as to be unsatisfactory as the TFT characteristics.

As described above, it has been revealed that when an oxide insulator film is formed on the In—Ga—Zn—O oxide semiconductor, the film formation is required to be carried out in an oxygen-including atmosphere.

Example 9

(Staggered TFT)

Figure 14:
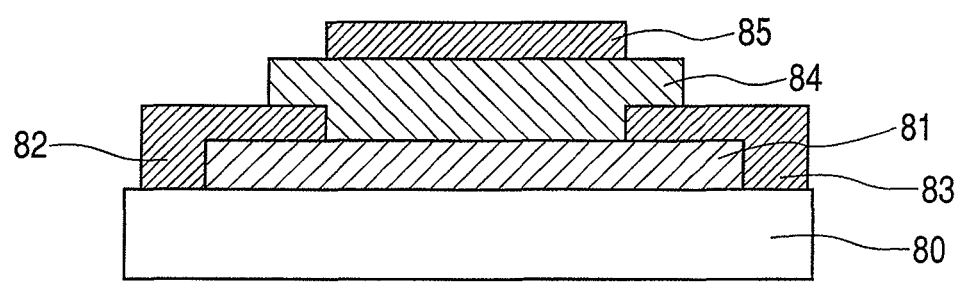
FIG. 14 is a sectional view of a staggered TFT.

A staggered TFT device shown in FIG. 14 was fabricated.

A Corning 1737 glass substrate was used as a substrate 80.

First, with a polycrystalline sintered body having the composition of $InGaO_3(ZnO)$ as a target, a 40 nm thick In—Ga—Zn—O oxide semiconductor thin film was deposited on the substrate 80 as a channel layer 81 by a RF sputtering method.

In present Example, the applied RF power was 300 W. The atmosphere at the time of film formation was such that the total pressure was 0.5 Pa, and the gas flow rate ratio was $Ar:O_2$=97:3. The film formation rate was 12 nm/min, and the substrate temperature was 25° C.

A 5 nm thick Ti layer and a 50 nm thick Au layer were laminated on the channel layer by an electron beam deposition method. The laminated film was applied with a photolithography method and a liftoff method to form a source electrode 82 and a drain electrode 83.

The deposited In—Ga—Zn—O oxide semiconductor thin film was applied with a photolithography method and an etching method to be processed to an appropriate size.

At this stage, annealing was carried out in an oxygen atmosphere at 200° C. for 50 minutes.

Further thereon, a 150 nm thick $Y_2O_3$ film was formed by a RF sputtering method, and processed to an appropriate size by a photolithography method and an etching method to form a gate insulating film 84.

In present Example, the applied RF power was 500 W. The atmosphere at the time of film formation was such that the total pressure was 0.1 Pa, and the gas flow rate ratio was $Ar:O_2$=40:60. The film formation rate was 1.5 nm/min, and the substrate temperature was 25° C.

Further thereon, a 5 nm thick Ti layer and a 50 nm thick Au layer were laminated, and applied with a photolithography method and an etching method to form a gate electrode 85.

The TFT fabricated in Example 9 was evaluated to attain such transistor characteristics as satisfactory as those of the devices fabricated as inversely staggered devices.

Example 10

(TFT using $SiO_xN_y$ in the Protection Layer)

An inversely staggered TFT device shown in FIG. 7 was fabricated.

A Corning 1737 glass substrate was used as a substrate 10.

First, a 5 nm thick Ti layer, a 50 nm thick Au layer and another 5 nm thick Ti layer were laminated on the substrate 10 in this order by an electron beam deposition method. The laminated film was applied with a photolithography method and a liftoff method to form a gate electrode 11.

Further thereon, a 150 nm thick $Y_2O_3$ film was formed by a RF sputtering method to form a gate insulating film 12.

Successively, with a polycrystalline sintered body having the composition of $InGaO_3(ZnO)$ as a target, a 40 nm thick In—Ga—Zn—O oxide semiconductor thin film was deposited as a channel layer 13 by a RF sputtering method.

In present Example, the applied RF power was 200 W. The atmosphere at the time of film formation was such that the total pressure was 0.5 Pa, and the gas flow rate ratio was $Ar:O_2$=95:5. The film formation rate was 8 nm/min, and the substrate temperature was 25° C.

The deposited In—Ga—Zn—O oxide semiconductor thin film was applied with a photolithography method and an etching method to be processed to an appropriate size.

At this stage, annealing was carried out in the air at 300° C. for 30 minutes.

Further thereon, a 5 nm thick Ti layer, a 50 nm thick Au layer and another 5 nm thick Ti layer were laminated in this order, and a source electrode 14 and a drain electrode 15 were formed by a photolithography method and a liftoff method.

Further thereon, a 100 nm thick $SiO_xN_y$ film was deposited as a protection layer 16 by a RF sputtering method.

In present Example, the applied RF power was 400 W. The atmosphere at the time of film formation was such that the total pressure was 0.1 Pa, and the gas flow rate ratio was $Ar:O_2$=40:60. The film formation rate was 2 nm/min, and the substrate temperature was 25° C.

Finally, contact holes were formed by removing a portion on each of the gate electrode 11, the drain electrode 15 and the source electrode 14 by a photolithography method and an etching method.

In the manner as described above, the TFT device was fabricated.

The TFT characteristics were evaluated after the protection layer formation to give the performances and stability equivalent to those of the cases where $SiO_2$ was used for the protection layer.

According to the present invention, the metal oxide film to be used as the channel layer is formed under the conditions to have low resistance, and hence a high quality oxide film is formed and accordingly, a thin film transistor excellent in characteristics can be fabricated. The oxygen partial pressure in the metal oxide film formation atmosphere is not needed to be controlled in a sophisticated manner and the process margin can be widened, yielding advantages such that a highly reliable production method of TFT can be obtained.

Additionally, according to the present invention, for example, it is possible to provide a TFT device using an amorphous oxide semiconductor as an active layer (also referred to as a channel layer) wherein the device is stable against the environmental variation and has highly reliable and satisfactory transistor characteristics.

This application claims the benefit of the Japanese Patent Application No. 2006-226698, filed Aug. 23, 2006, which is incorporated by reference herein in its entirety.

The invention claimed is:

1. A production method for a thin film transistor comprising an active layer comprising an oxide semiconductor film including at least one element of In and Zn, the method comprising the sequence of steps of:
   (1) a first step of forming a metal oxide film, wherein the metal oxide film has a first resistivity of $1 \times 10^{-4}$ Ωcm or more and 1 Ωcm or less;
   (2) a second step of annealing the metal oxide film in an oxidative atmosphere to obtain an oxide semiconductor film with a second resistivity which is 1 Ωcm or more and $1 \times 10^4$ Ωcm or less; and
   (3) a third step of forming an insulating oxide layer on the oxide semiconductor film.

2. The method according to claim 1, wherein the annealing converts the activation energy of the oxide semiconductor film from a first activation energy to a second activation energy lower than the first activation energy.

3. The method according to claim 2, wherein the first activation energy is 0 meV or more and 50 meV or less, and the second activation energy is 50 meV or more and 400 meV or less at room temperature.

4. The method according to claim 1, wherein the annealing is performed in an atmosphere comprising a gas comprising oxygen as a constituent element thereof in a temperature range of 250° C. or higher and 450° C. or lower.

5. The method according to claim 1, wherein in the second step the metal oxide film is irradiated with ultraviolet light and also annealed an in atmosphere comprising oxygen radical or ozone in a temperature range of 150° C. or higher and 450° C. or lower.

6. The method according to claim 1, wherein the oxide semiconductor film comprises at least one of Ga and Sn.

7. The method according to claim 1, wherein the oxide semiconductor film has an atomic composition ratio In/(In+Zn) of 30 atom % or more and 45 atom % or less.

8. The method according to claim 1, wherein the temperature in the first step at which the metal oxide film is formed is equal to or lower than the annealing temperature of the second step.

9. The method according to claim 1, wherein the temperature in the third step at which the insulating oxide layer is formed is equal to or lower than the annealing temperature of the second step.

10. The method according to claim 1, wherein the insulating oxide layer includes at least one out of $SiO_2$, $Y_2O_3$, and $SiO_xN_y$.

11. The method according to claim 1, wherein the oxide semiconductor film is formed using sputtering.

12. The method according to claim 1, wherein the insulating oxide layer is formed using sputtering in an oxidative atmosphere.

13. The method according to claim 12, wherein the oxidative atmosphere has 10% to 80% of oxygen content.

14. The method according to claim 13, wherein the oxidative atmosphere has 30% to 60% oxygen content.

15. A production method for a thin film transistor
    comprising an active layer comprising an oxide semiconductor film including at least one element of In and Zn, the method comprising the sequence of steps of:
    (1) a first step of forming a metal oxide film, wherein the metal oxide film has a first resistivity of $1 \times 10^{-4}$ Ωcm or more and 1 Ωcm or less; and
    (2) a second step of annealing the metal oxide film in an oxidative atmosphere to obtain an oxide semiconductor film with a second resistivity which is 1 Ωcm or more and $1 \times 10^4$ Ωcm or less, wherein a temperature range of the annealing is 150° C. or higher and 450° C. or lower.

* * * * *